(12) United States Patent
McMillan et al.

(10) Patent No.: US 8,828,801 B2
(45) Date of Patent: *Sep. 9, 2014

(54) LEADLESS ARRAY PLASTIC PACKAGE WITH VARIOUS IC PACKAGING CONFIGURATIONS

(71) Applicant: UTAC Hong Kong Limited, Tsuen Wan (CN)

(72) Inventors: John McMillan, Seaview, WA (US); Serafin P. Pedron, Jr., Manteca, CA (US); Kirk Powell, Greeley, CO (US); Adonis Fung, Tsing Yi (HK)

(73) Assignee: UTAC Hong Kong Limited, Tsuen Wan (HK)

( * ) Notice: Subject to any disclaimer, the term of this patent is extended or adjusted under 35 U.S.C. 154(b) by 0 days.

This patent is subject to a terminal disclaimer.

(21) Appl. No.: 13/916,391

(22) Filed: Jun. 12, 2013

(65) Prior Publication Data

US 2013/0273692 A1    Oct. 17, 2013

Related U.S. Application Data

(63) Continuation of application No. 13/254,905, filed as application No. PCT/US2010/026562 on Mar. 8, 2010, now Pat. No. 8,486,762.

(60) Provisional application No. 61/158,170, filed on Mar. 6, 2009.

(51) Int. Cl.
*H01L 21/00* (2006.01)
*H01L 23/00* (2006.01)
*H01L 23/495* (2006.01)
*H01L 23/31* (2006.01)
*H01L 21/48* (2006.01)
*H01L 21/56* (2006.01)

(52) U.S. Cl.
CPC ... *H01L 21/4832* (2013.01); *H01L 2924/01046* (2013.01); *H01L 2224/49171* (2013.01); *H01L 2924/01033* (2013.01); *H01L 2224/48257* (2013.01); *H01L 24/49* (2013.01); *H01L 2224/32245* (2013.01); *H01L 2924/01078* (2013.01); *H01L 23/49575* (2013.01); *H01L 2224/45124* (2013.01); *H01L 23/49589* (2013.01); *H01L 2224/48247* (2013.01); *H01L 2224/73265* (2013.01); *H01L 2924/01322* (2013.01); *H01L 2924/10329* (2013.01); *H01L 2224/48145* (2013.01); *H01L 23/49548* (2013.01); *H01L 2924/014* (2013.01); *H01L 2225/06568* (2013.01); *H01L 23/49541* (2013.01); *H01L 2924/01005* (2013.01); *H01L 2924/19041* (2013.01); *H01L 2924/01028* (2013.01); *H01L 2224/16245* (2013.01); *H01L 2924/01047* (2013.01); *H01L 2924/19105* (2013.01); *H01L 2224/2919* (2013.01); *H01L 23/49537* (2013.01); *H01L 2924/14* (2013.01); *H01L 2924/30107* (2013.01); *H01L 23/3121* (2013.01); *H01L 2924/01013* (2013.01); *H01L 2224/49433* (2013.01); *H01L 2924/01029* (2013.01); *H01L 2224/48091* (2013.01); *H01L 2224/29111* (2013.01); *H01L 2924/01014* (2013.01); *H01L 24/48* (2013.01); *H01L 2924/0132* (2013.01); *H01L 2924/0105* (2013.01); *H01L 2924/01079* (2013.01); *H01L 2224/32145* (2013.01); *H01L 23/4952* (2013.01); *H01L 2924/01082* (2013.01); *H01L 21/565* (2013.01); *H01L 2924/01006* (2013.01)
USPC .......................................................... 438/111

(58) Field of Classification Search
CPC ................. H01L 23/49582; H01L 23/49541; H01L 23/3121; H01L 23/49537; H01L 23/49548; H01L 23/49589
USPC ................... 438/106–126, 612–616
See application file for complete search history.

(56) References Cited

U.S. PATENT DOCUMENTS 6,489,218 B1 * 12/2002 Kim et al. .................... 438/460
7,153,724 B1 * 12/2006 Sirinorakul et al. .......... 438/112
8,063,470 B1 * 11/2011 Sirinorakul et al. .......... 257/666

*Primary Examiner* — Brook Kebede
(74) *Attorney, Agent, or Firm* — Winstead PC

(57) ABSTRACT

A leadless integrated circuit (IC) package comprising an IC chip mounted to a die-attach area and a plurality of electrical contacts electrically connected to the IC chip. The IC chip, the electrical contacts, and the die-attach area are all covered with a molding material, with portions of the electrical contacts and die-attach area protruding from a bottom surface of the molding material.

20 Claims, 14 Drawing Sheets

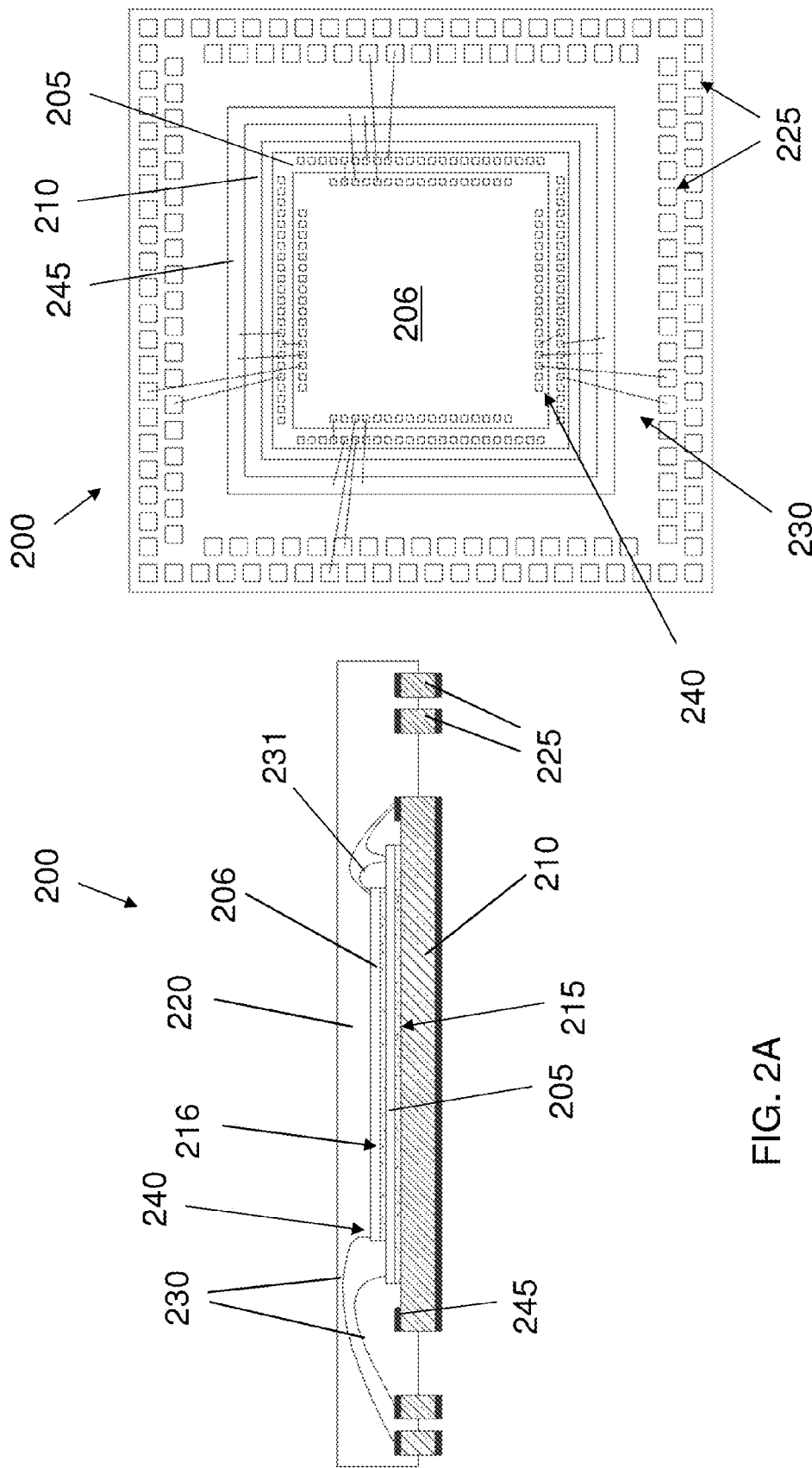

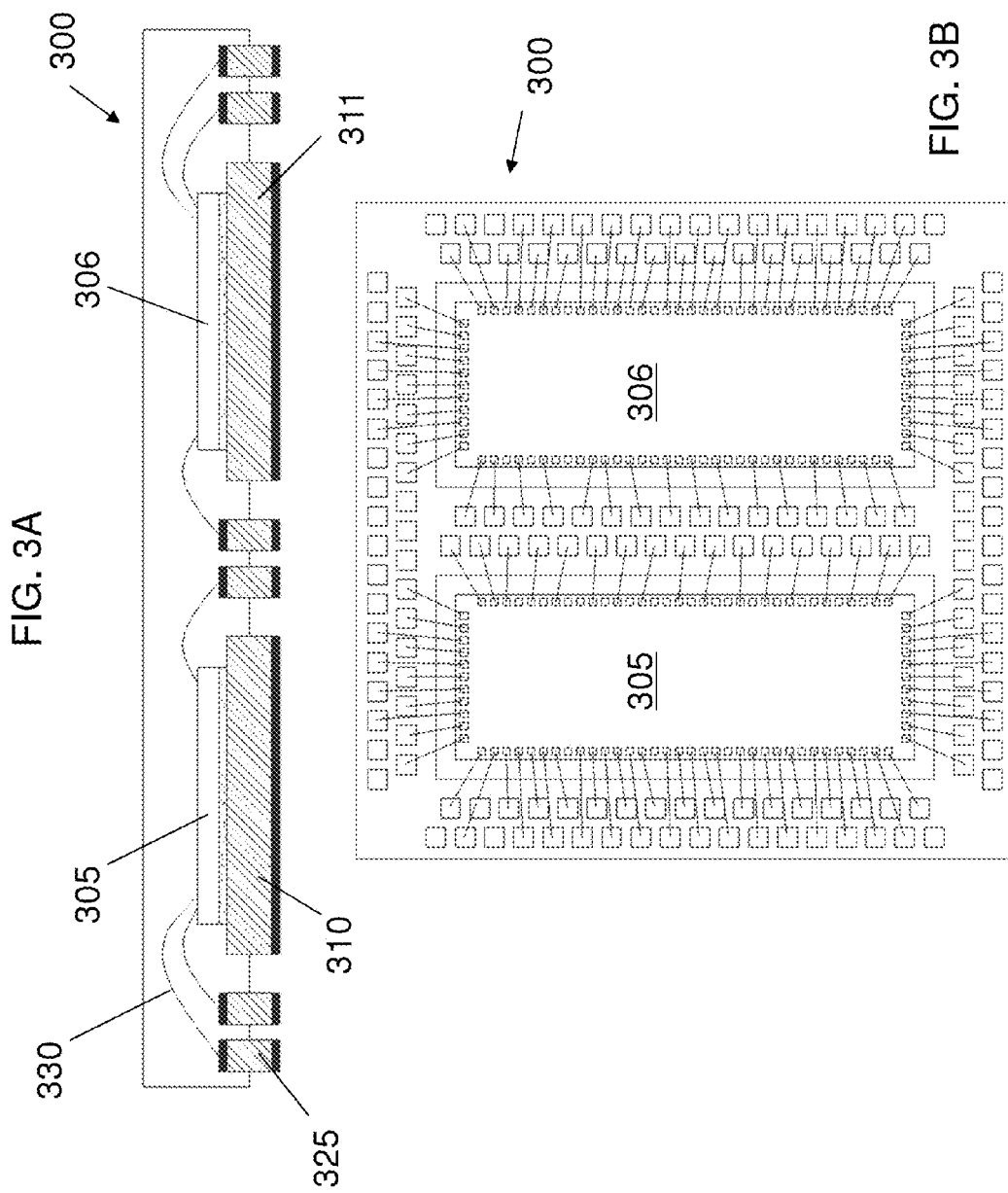

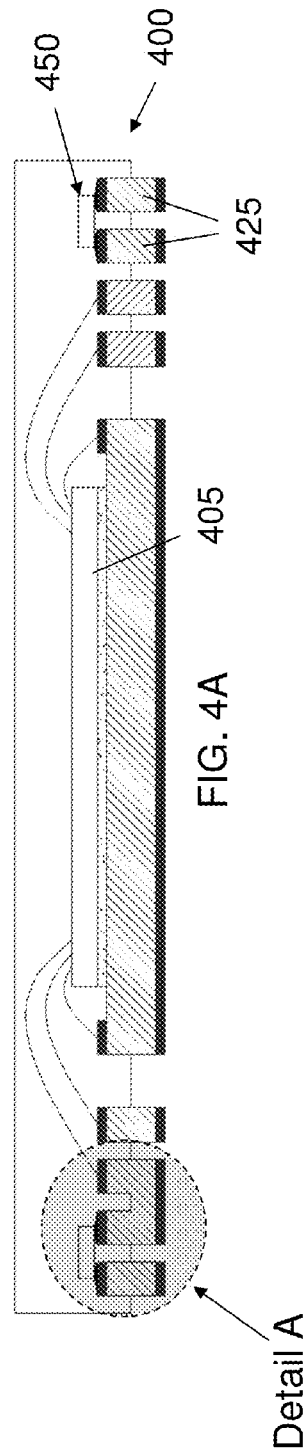
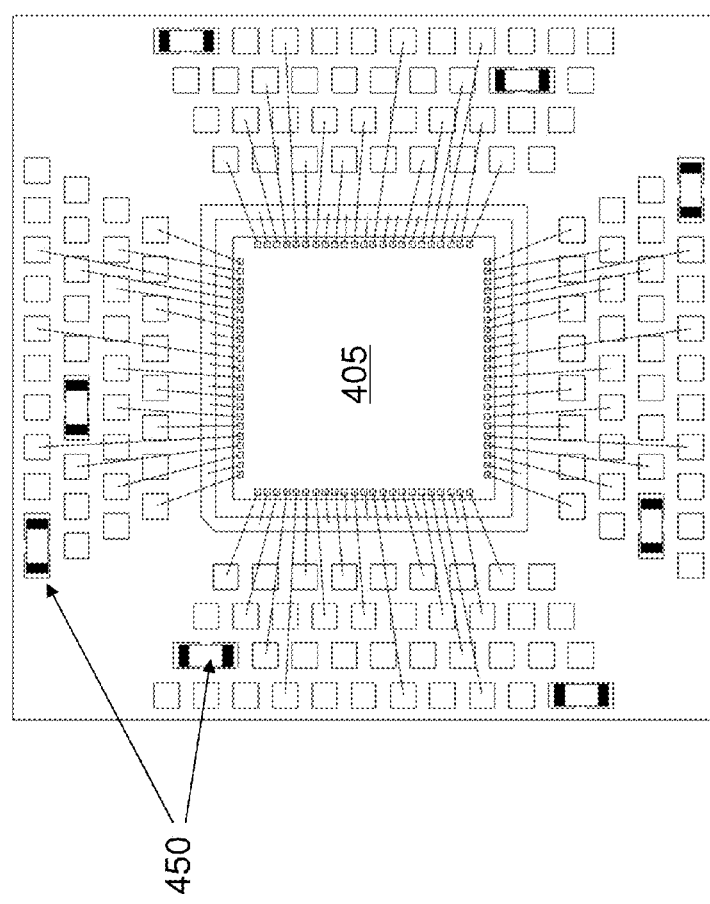
FIG. 4A
FIG. 4B

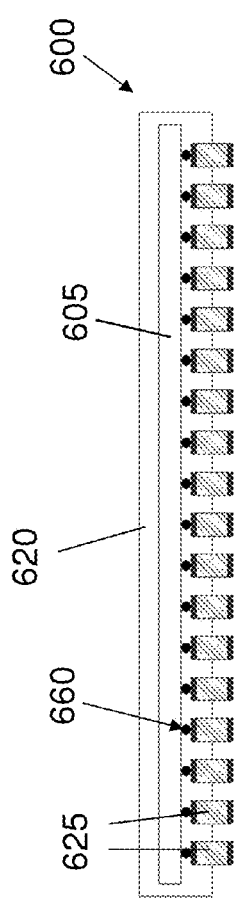
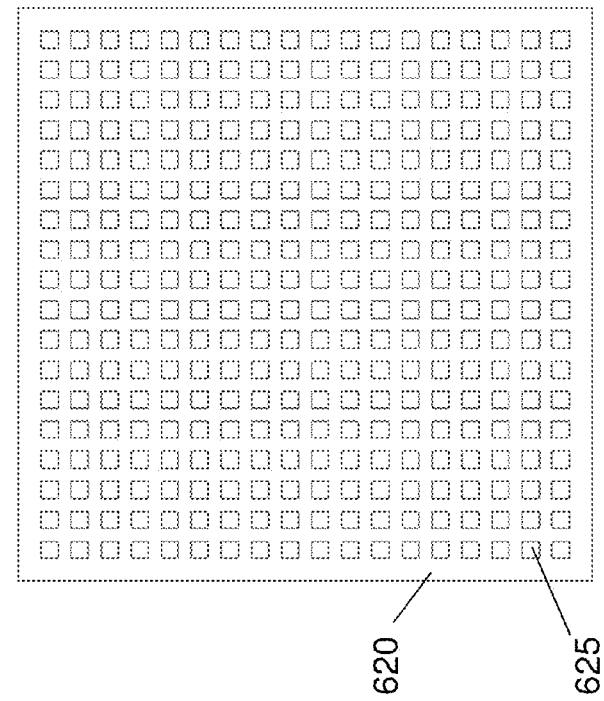

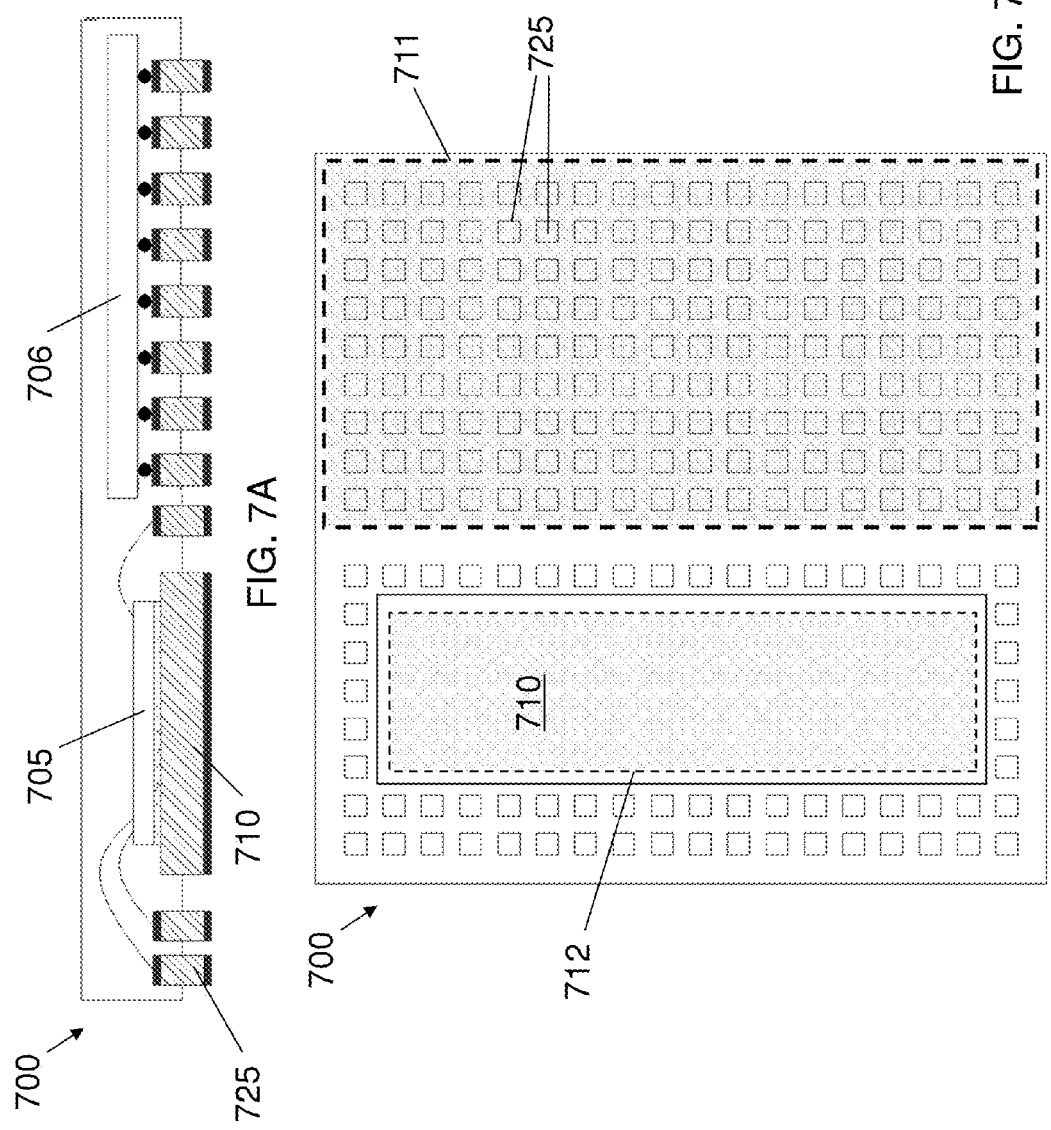

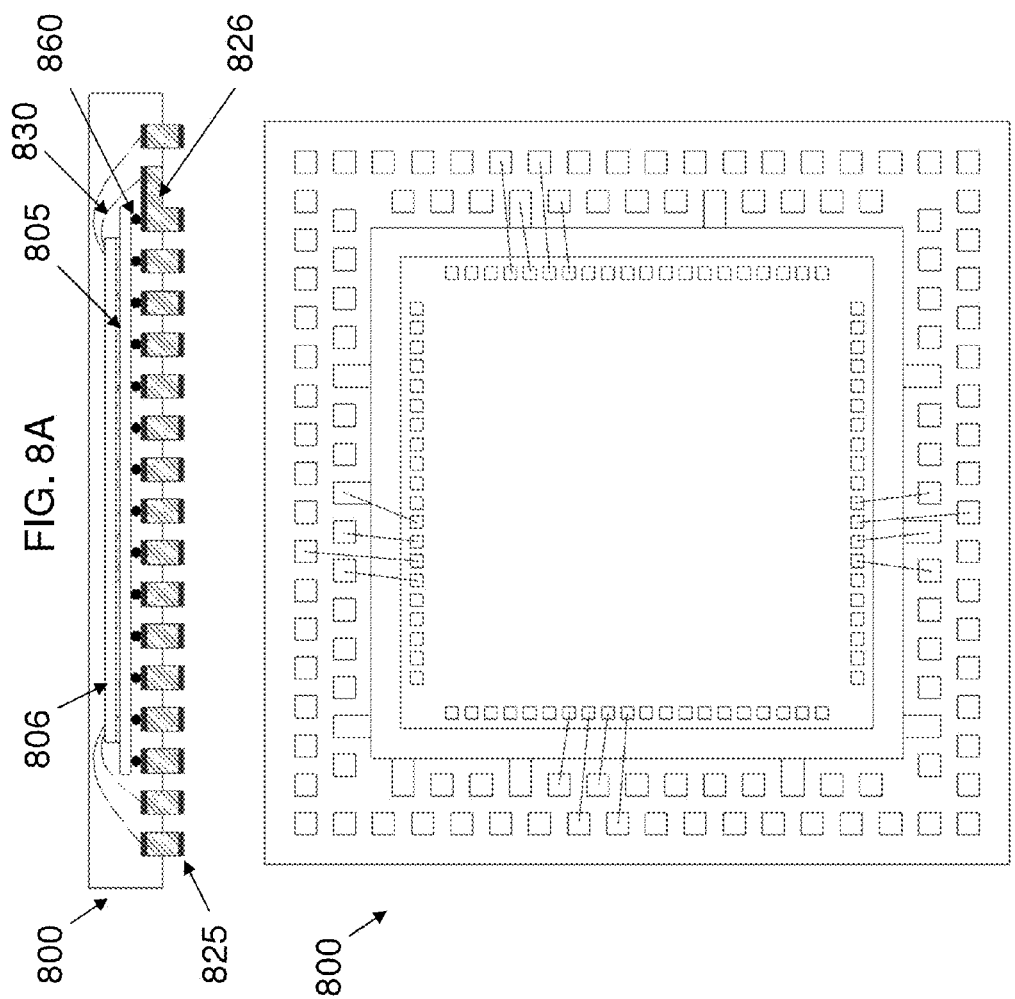

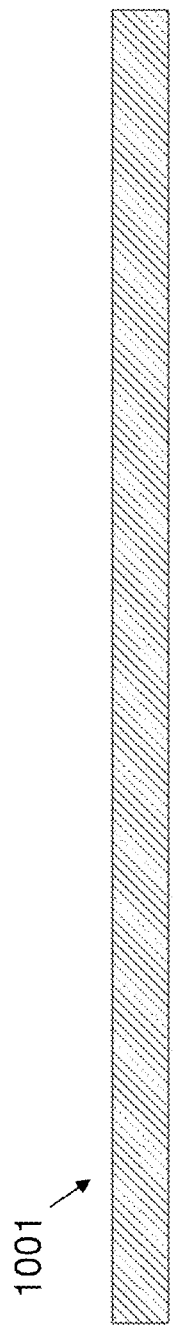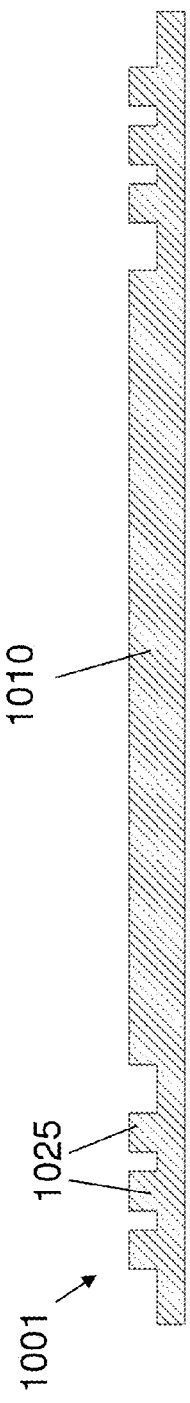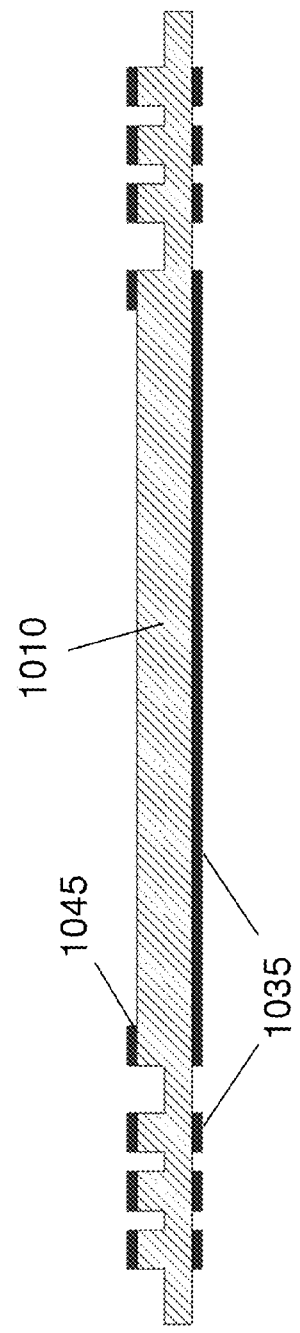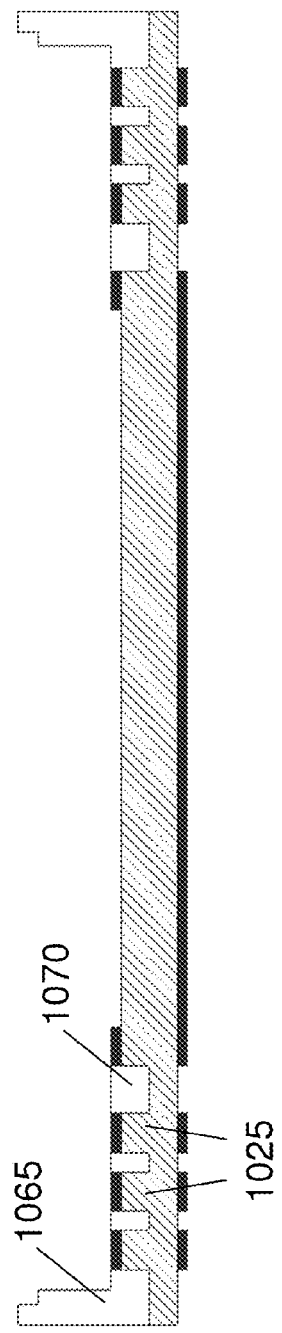

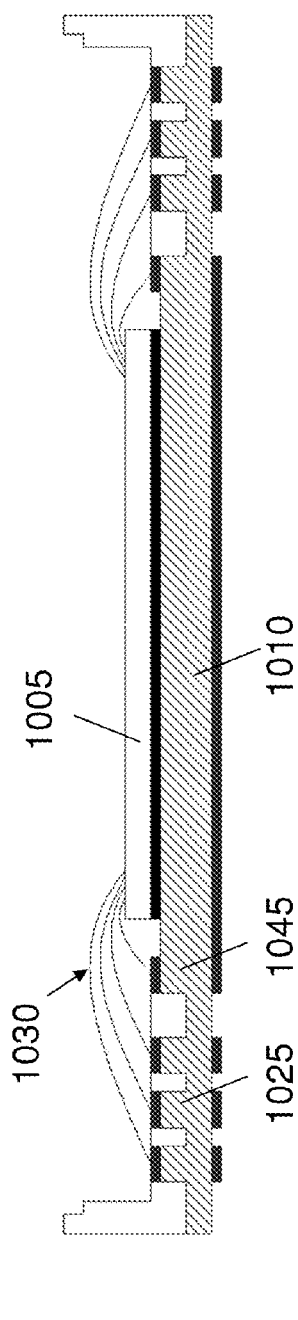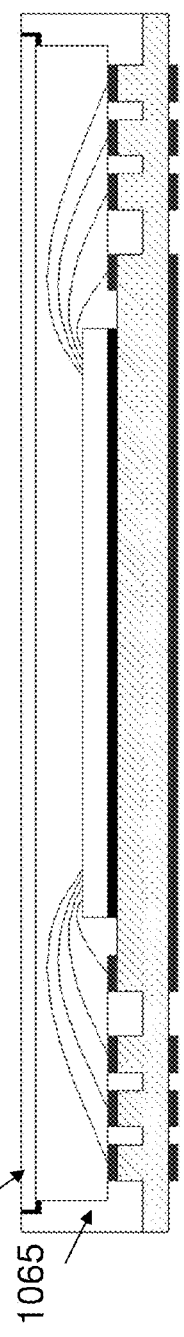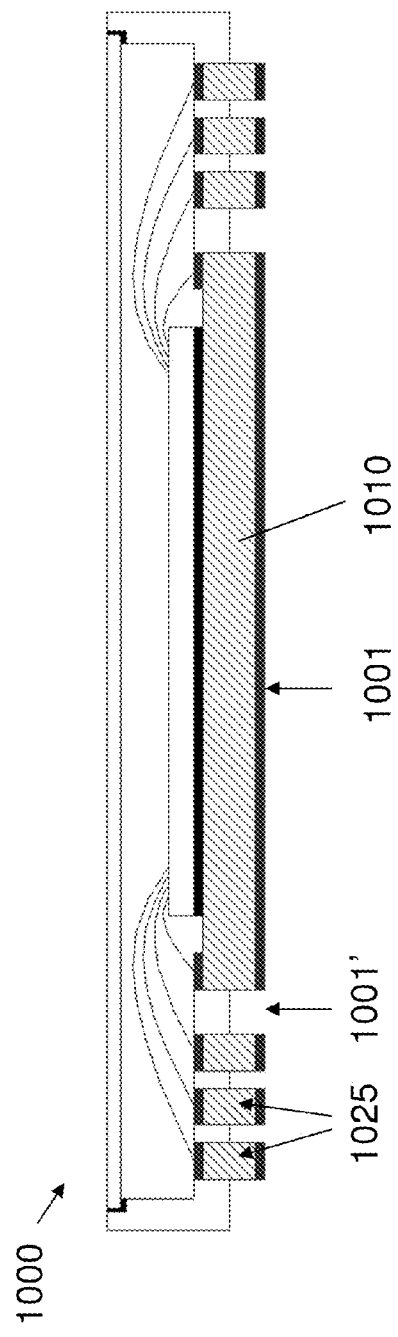

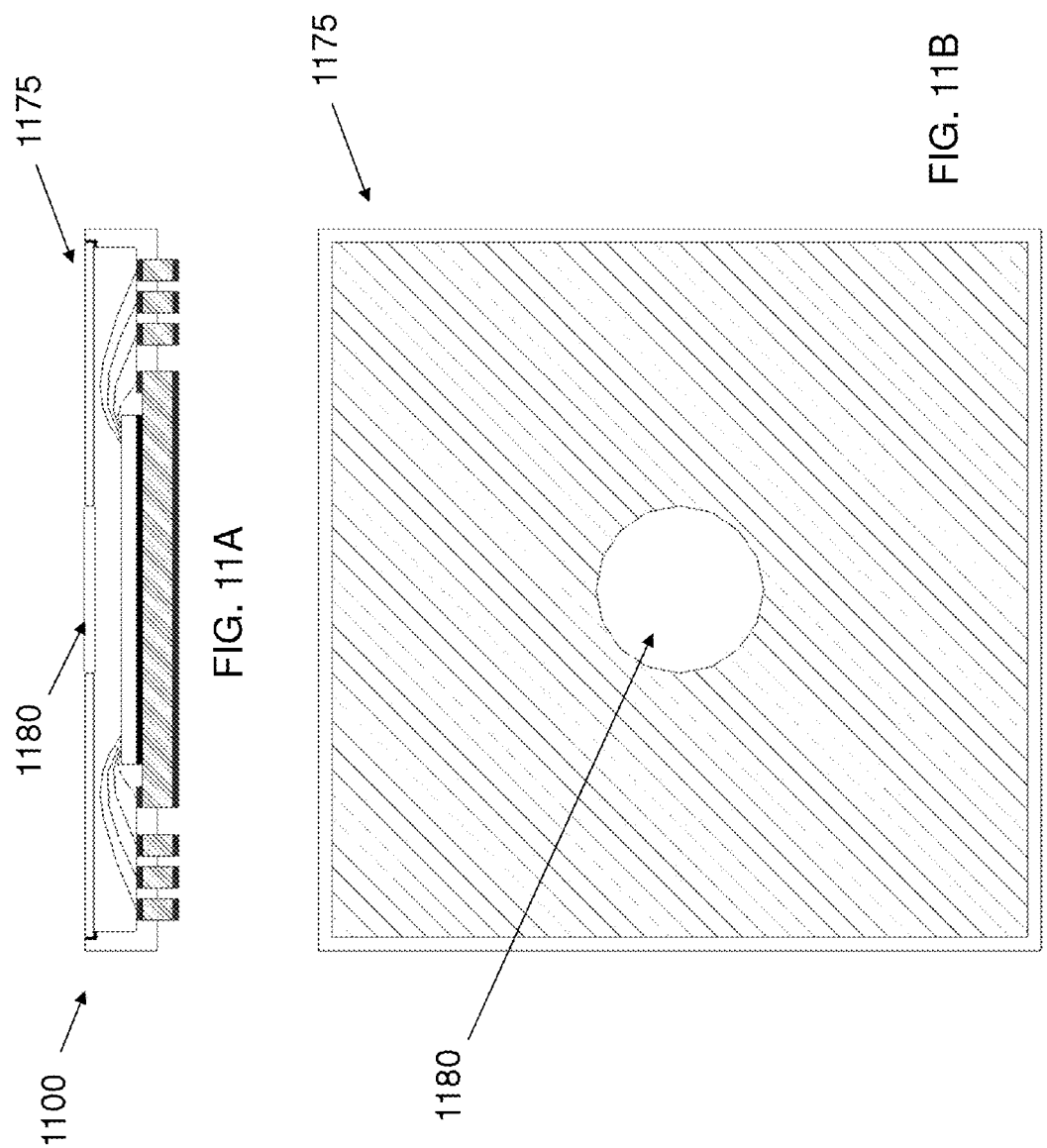

US 8,828,801 B2

LEADLESS ARRAY PLASTIC PACKAGE WITH VARIOUS IC PACKAGING CONFIGURATIONS

CROSS-REFERENCE TO RELATED APPLICATIONS

This patent application is a continuation of U.S. patent application Ser. No. 13/254,905, filed Apr. 11, 2011. U.S. patent application Ser. No. 13/254,905 is a U.S. National Stage filing of International Application No. PCT/US2010/026562, filed Mar. 8, 2010. PCT/US2010/026562 claims priority from U.S. Provisional Application No. 61/158,170, filed Mar. 6, 2009. This application incorporates by reference U.S. patent application Ser. No. 13/254,905; PCT/US2010/026562; U.S. Provisional Application No. 61/158,170; U.S. Pat. No. 6,229,200, filed Jun. 10, 1998; U.S. Pat. No. 6,498,099, filed Apr. 9, 1999; and U.S. Pat. No. 7,049,177, filed 28 Jan. 2004.

BACKGROUND

1. Technical Field

This invention relates generally to integrated circuit (IC) packaging technology, and more particularly, but not by way of limitation, to leadless IC packages and related methods of manufacture.

2. Background

Systems, methods, and technology for integrated circuit (IC) packaging is of critical importance in the computerized global economy. One of the final stages involved in the fabrication of IC devices is the packaging of the IC chip. During the packaging process, one or more IC chips are mounted on a package substrate, connected to electrical contacts, and then coated with a molding material comprising an electrical insulator such as epoxy or silicone molding compound. The resulting structure—commonly known as an "IC package"—is then connected to other electrical components, for example, on a printed circuit board (PCB) for use in a computer or the like.

In most IC packages, the IC chip is completely covered by the molding material, while the electrical contacts are at least partially exposed so that they can be connected to other electrical components. In other words, the electrical contacts are designed to form electrical connections between the IC chip inside the molding material, and electrical components outside the molding material. One of the most common designs for these electrical contacts is one in which they form "leads" extending out the sides of the molding material. The leads typically are bent downward to form connections with electrical components on a PCB.

Unfortunately, the presence of external leads tends to significantly increase the size of IC packages. For instance, it tends to increase the length and width across the IC packages due to the horizontal extension of the leads. This is a disadvantage because, among other reasons, increased size is often problematic in systems where PCB space is limited. In addition, because the external leads are typically arranged along the sides of the IC packages, the pin count of the IC packages is limited by the linear distance around the IC packages. Additionally, these leads require an additional inspection step for straightness, coplanarity, and other required mechanical dimensions (and rework or scrap if they fail the specification). Finally, the leads (starting from the bonding fingers down to the tip of the external portions) add to the total electrical signal length (bond wires+leads), which affect the electrical performance of the IC chip.

Recognizing these and other problems with conventional IC packages, researchers have developed IC packages in which the external leads are replaced by electrical contacts that are covered on top by the molding material, but exposed on the bottom of the IC package so they can be connected to electrical components located beneath the IC package. These IC packages—referred to as "leadless" IC packages—tend to occupy less space compared with conventional IC packages due to the absence of the external leads. In addition, these IC packages eliminate the need for bending the leads to form connections.

Some examples of conventional leadless IC packages are disclosed in related and commonly assigned U.S. Pat. Nos. 6,229,200, 6,498,099, and 7,049,177, the entirety of the respective disclosures of which are hereby incorporated by reference into the present application. Among other things, these patents describe and illustrate a plurality of design variations for leadless IC packages and techniques for manufacturing and using the leadless IC packages.

SUMMARY

The disclosed embodiments include leadless IC packages having a variety of different configurations. In different embodiments, leadless packages may have varied configurations of electrical contacts, IC chips, and connections between the IC chips and the electrical contacts. The varied connection configurations may include, for instance, different flip-chip configurations, wire-bond attachment configurations, and solder attachment configurations. The described embodiments also include IC packages having chip-on-lead configurations.

In one embodiment, a method of manufacturing a leadless integrated circuit (IC) package is described, the method including providing a leadframe strip having top and bottom surfaces; removing portions of the top surface of the leadframe strip to form recesses therein partially defining upper portions of one or more die-attach areas and upper portions of a plurality of electrical contacts; mounting a first IC chip to the leadframe strip in a first die-attach area of the partially defined one or more die-attach areas; mounting a second IC chip in a second die-attach area of the partially defined one or more die-attach areas; forming electrical connections between the plurality of partially defined electrical contacts and the first IC chip; covering the first IC chip, the second IC chip, the partially defined one or more die-attach areas, the partially defined electrical contacts, and the electrical connections with a molding layer, the molding layer filling the recesses; forming an etch-resist layer on the bottom surface of the leadframe strip corresponding to the partially defined one or more die-attach areas and the plurality of partially defined electrical contacts; and selectively etching the bottom surface of the leadframe strip using the etch-resist layer as an etching mask, thereby etching through portions of the leadframe strip to define lower portions of the plurality of electrical contacts and lower portions of the one or more die-attach areas.

In another embodiment, a method of manufacturing a leadless integrated circuit (IC) package is described, the method including providing a leadframe strip having top and bottom surfaces; removing portions of the top surface of the leadframe strip to form recesses therein partially defining upper portions of a plurality of electrical contacts; mounting an IC chip to the plurality of partially defined electrical contacts in a flip-chip configuration; forming electrical connections between the plurality of partially defined electrical contacts and the IC chip; covering the IC chip and the plurality of partially defined electrical contacts with a molding layer, the molding layer filling the recesses; forming an etch-resist layer on the bottom surface of the leadframe strip corresponding to the plurality of partially defined electrical contacts; and selectively etching the bottom surface of the leadframe strip using the etch-resist layer as an etching mask, thereby etching through portions of the leadframe strip to define lower portions of the plurality of electrical contacts.

In another embodiment, a method of manufacturing a leadless integrated circuit (IC) package is described, the method including providing a leadframe strip having top and bottom surfaces; removing portions of the top surface of the leadframe strip to form recesses therein partially defining an upper portion of a die-attach area and an upper portion of a plurality of electrical contacts; forming sidewalls around a periphery of the leadframe strip; filling the recesses with a molding layer; mounting an IC chip to the leadframe strip in the partially defined die-attach area; forming electrical connections between the plurality of partially defined electrical contacts and the IC chip; providing a lid configured to be attached to the sidewalls; attaching the lid to the sidewalls, the lid, the sidewalls, the leadframe strip, and the molding layer defining a sealed air cavity therein; forming an etch-resist layer on the bottom surface of the leadframe strip corresponding to the partially defined die-attach area and the plurality of partially defined electrical contacts; and selectively etching the bottom surface of the leadframe strip using the etch-resist layer as an etching mask, thereby defining the plurality of electrical contacts and the die-attach area as separate component.

In another embodiment, a method of manufacturing a leadless integrated circuit (IC) package is described, the method including providing a leadframe strip having top and bottom surfaces; removing portions of the top surface of the leadframe strip to form recesses therein partially defining an upper portion of a die-attach area and upper portions of a plurality of electrical contacts; mounting an IC chip to the leadframe strip in the partially patterned die-attach area; mounting a passive electronic component to the plurality of partially patterned electrical contacts; forming electrical connections between the plurality of partially defined electrical contacts and the IC chip; covering the IC chip, the passive electronic component, the partially defined at least one die-attach area, the partially defined electrical contacts, and the electrical connections with a molding layer, the molding layer filling the recesses; forming an etch-resist layer on the bottom surface of the leadframe strip corresponding to the partially defined at least one die-attach area and the plurality of partially defined electrical contacts; and selectively etching the bottom surface of the leadframe strip using the etch-resist layer as an etching mask, thereby etching through portions of the leadframe strip to define lower portions of the plurality of electrical contacts and a lower portion of the at least one die-attach area.

The above summary of the invention is not intended to represent each embodiment or every aspect of the present invention.

BRIEF DESCRIPTION OF THE DRAWINGS

A more complete understanding of various embodiments of the present invention may be obtained by reference to the following Detailed Description when taken in conjunction with the accompanying Drawings, wherein:

FIGS. 2A-2B are side and top views of an embodiment of a leadless IC package having stacked IC chips mounted to a die attach pad;

FIGS. 3A-3B are side and top views of an embodiment of a leadless IC package in a multi-chip module arrangement having two die attach pads each having an IC chip mounted thereon;

FIGS. 4A-4B are side and top views of an embodiment of a leadless IC package having a system-in-package configuration;

FIGS. 6A-6B are side and bottom views of an embodiment of a leadless IC package having a flip-chip configuration;

FIGS. 7A-7B are side and bottom views of an embodiment of a leadless IC package having two IC chips mounted therein, wherein one of the IC chips is in a flip-chip configuration;

FIGS. 8A-8B are side and top views of an embodiment of a leadless IC package having a flip-chip configuration and two IC chips mounted thereon in a stacked arrangement;

FIGS. 10A-10G are side views of an embodiment of a leadless IC package at various stages of an IC package manufacturing process; and FIGS. 11A-11B show an embodiment of a leadless IC package having an air cavity therein and a lid for use therewith.

DETAILED DESCRIPTION

Selected embodiments are described below with reference to the accompanying drawings. These embodiments are provided as teaching examples and should not be construed to limit the scope of the claims. For convenience of explanation, this description includes a number of orientation-specific terms, such as "top," "bottom," "over," "on," and so forth. These terms should not be construed to limit the orientation of the described articles, but are intended merely to reflect the relative positions of various components or portions thereof. For instance, a "bottom surface" may be interpreted to mean a surface opposite a "top surface," regardless of the orientation of the article having the bottom and top surfaces.

In general, various embodiments relate to leadless IC packages arranged in various configurations. These different configurations can be used to achieve any of several different purposes, such as avoiding electrical and/or physical interference between the die-attach pads (DAP) and circuit traces on a PCB underneath the package, improving heat-transfer characteristics of the DAP, facilitating surface mount to the PCB, providing special electrical connectivity within the DAP and/or electrical contacts and addressing space-based IC packaging constraints such as pin count, to name but a few. In the description that follows, a number of embodiments are presented in specific configurations. The disclosed configurations, however, are intended for illustration only and not for any limiting purpose. For example, more than one IC chip may be attached to the DAP in a side-by-side configuration, known as multi-chip module (MCM). The DAP itself may be one piece or segmented, in IC packages having multiple chips that, for example, may not share the same backplane. Alternatively, IC chips may be stacked one on top of the other in stacked-die configurations. Further, in some cases, the IC package may not have a DAP at all. For instance, the IC chip may be attached directly and partially on top of the electrical contacts using an electrically-insulative adhesive (known as chip-on-lead). The IC chip may also be attached to a die-attach area comprising a plurality of electrical contacts using flip-chip techniques, wherein the bond pads have solder bumps which may be reflowed to upper surfaces of the electrical contacts.

Some embodiments are also described with specific components such as certain types of IC chips including semiconductor processor die. However, these and other components may be substituted with other parts, modified, or supplemented with additional components. For example, passive components, such as chip resistors and capacitors, may be attached to the electrical contacts along with the IC chips (system-in-package). Moreover, specific materials in the described embodiments, such as certain types of metals, could be substituted with similar materials.

Figure 1B:
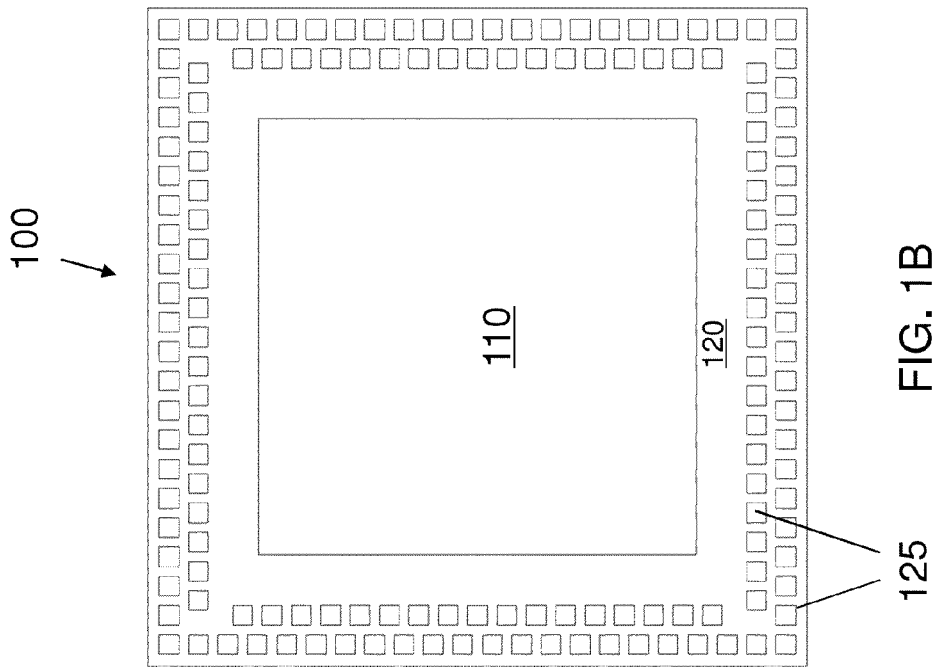
FIGS. 1A-1B are side and bottom views of an embodiment of a leadless IC package having two rows of electrical contacts around a perimeter of a die-attach pad.
Figure 1A:
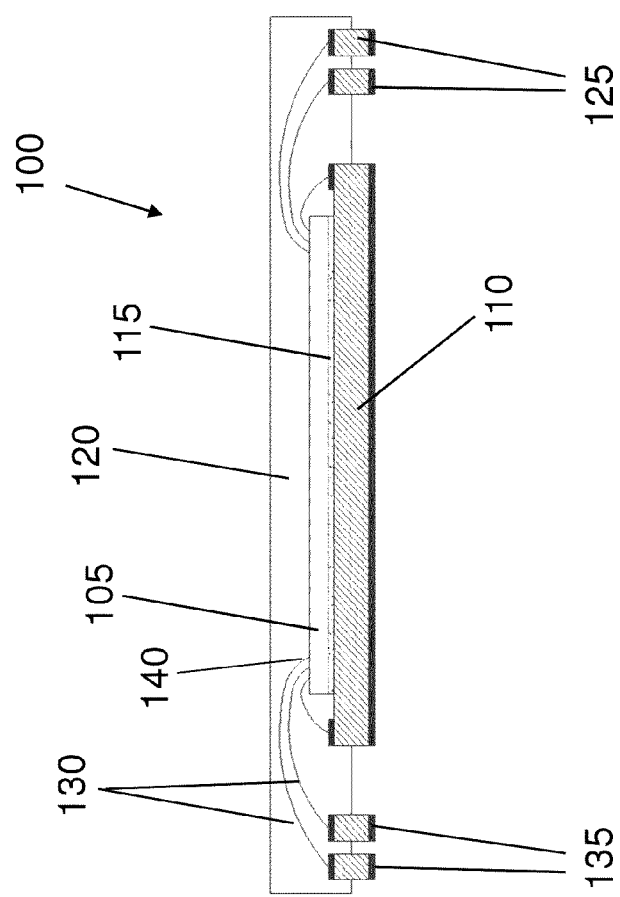

Turning now to the Drawings, FIGS. 1A-1B show side and bottom views of an embodiment of a leadless IC package 100. Referring to FIG. 1A in particular, IC package 100 is shown having an IC chip 105, a DAP 110, electrical contacts 125, wire bonds 130, and a molding layer 120. In the embodiment shown, IC chip 105 is mounted on DAP 110 by an adhesive layer 115. In various embodiments, adhesive layer 115 may be either a paste or film and may be, for example, a polymeric material such as epoxy, silicone, polyimide, a thermoplastic material, and/or a soft solder material such as gold-tin or various combinations of tin and/or lead alloys. IC chip 105 may comprise, among other things, a single transistor, a processor die, or a memory chip cut from a semiconductor wafer.

Still referring to FIG. 1A, IC chip 105 includes bonding pads 140 that act as input/output (I/O) terminals and are connected to electrical contacts 125 via wire bonds 130. Both DAP 110 and electrical contacts 125 may have a bondable metal layer 135 applied and/or plated on one or both of a top and bottom surface thereof. Bondable metal layer 135 may comprise metals such as a stack-up of nickel (Ni), palladium (Pd), gold (Au), silver (Ag), or a combination of two or more metals such as NiPdAu, electrolytic or immersion tin (Sn), tin/lead (Sn/Pb), tin alloy or other solder finishes, or hot dip or bare copper (Cu) with a coating of a organic solderability preservative (OSP). The top and bottom surfaces of DAP 110 and electrical contacts 125 may be plated by the same material or may be plated with different materials. Layer 135 may serve any of several functions, including, for instance, enhancing wire bondability of a top layer, protecting the plated surfaces against oxidation, improving solderability, and improving electrical conductivity.

Still referring to FIG. 1A, molding layer 120 may be applied in such a way so as to cover IC chip 105, wire bonds 130, DAP 110, and electrical contacts 125, but leave portions of DAP 110 and electrical contacts 125 exposed on a bottom surface thereof. In embodiments where exposed portions of DAP 110 and electrical contacts 125 protrude from molding layer 120, the exposed portions may form a "standoff" DAP and "standoff" contacts, respectively, protruding from the bottom surface of molding layer 120 by a measurable distance, such as, for example, less than or equal to 0.012 mm to greater than or equal to 0.5 mm.

Referring now to FIG. 1B, a bottom view of IC package 100 is shown, where bottom surfaces of DAP 110 and electrical contacts 125 can be seen isolated from each other by molding compound 120 interposed therebetween. In embodiments having exposed portions of DAP 110 and electrical contacts 125, the exposed portions may be used, for example, to provide a solderable surface for soldering IC package 100 to a PCB or another substrate, to provide a thermal dissipation surface or heat sink, and/or to provide electrical connections between IC package 100 and external electrical components.

Referring now to FIGS. 2A-2B in general, side and top views are shown of an embodiment of a leadless IC package 200 having an IC package assembly mounted therein comprising an IC chip 206 mounted to an IC chip 205 in a stacked relationship. Similar to the embodiment shown in FIG. 1A, IC package 200 has a DAP 210, electrical contacts 225, wirebonds 230, and a molding layer 220. In the embodiment of IC package 200 shown, IC chip 205 has been mounted to DAP 210 with an adhesive layer 215 disposed therebetween. In addition, IC chip 206 has been mounted to IC chip 205 with an adhesive layer 216 disposed therebetween. In the embodiment shown, a metal plating has been applied to a periphery of DAP 210 to form a grounding ring 245 thereon. In various embodiments, IC chip 205 and IC chip 206 may be electrically coupled to each other via wirebonds 231 electrically coupled to bonding pads 240 disposed thereon. In addition, wirebonds 230 may electrical couple IC chip 205 and/or IC chip 206 to one or more of DAP 210, grounding/power ring 245, and electrical contacts 225. In the embodiment shown, by stacking IC chip 206 on top of IC chip 205, the functionality of IC package 200 may be increased relative to an IC package with only one IC chip disposed therein without increasing the package body size or "footprint" thereof.

Referring now to FIG. 2B, for descriptive purposes, a top view of IC package 200 is shown before a molding layer has been applied. From this view, the IC chip assembly, comprising IC chip 206 mounted on top of IC chip 205, can be seen mounted onto DAP 210. A plurality of bonding pads 240 can be seen disposed around a periphery of IC chips 205 and 206. Additionally, a plurality of wire bonds 230 can be seen coupling the bonding pads 240 to one or more of other bonding pads 240, electrical contacts 225, and grounding/power ring 245. While grounding/power ring 245 is shown as a ring on an upper surface of DAP 210, around a perimeter thereof, in various embodiments, grounding ring 245 may be a plurality of distinct pads plated onto DAP 210, rather than a continuous ring, or may not include any plating. While IC chips 205 and 206 and DAP 210 are shown disposed near a central region of IC package 200, in various embodiments, DAP 210 and IC chips 205 and 206 may be disposed in any region of IC package 200.

Referring now to FIGS. 3A-3B collectively, side and top views are shown of an embodiment of a leadless IC package 300 in a multi-chip module arrangement having a first IC chip 305 mounted next to a second IC chip 306, in a generally side-by-side orientation. For descriptive purposes, the top view of IC package 300 in FIG. 3B is shown before a molding layer has been applied. In the embodiment shown, IC chip 305 is mounted to DAP 310 and IC chip is mounted to DAP 311, where DAP 310 is distinct from DAP 311. However, in various embodiments, IC chips 305 and 306 may be mounted to a common DAP. In the embodiment shown, wirebonds 330 can be seen electrically coupling IC chips 305 and 306 to electrical contacts 325.

Figure 3C:
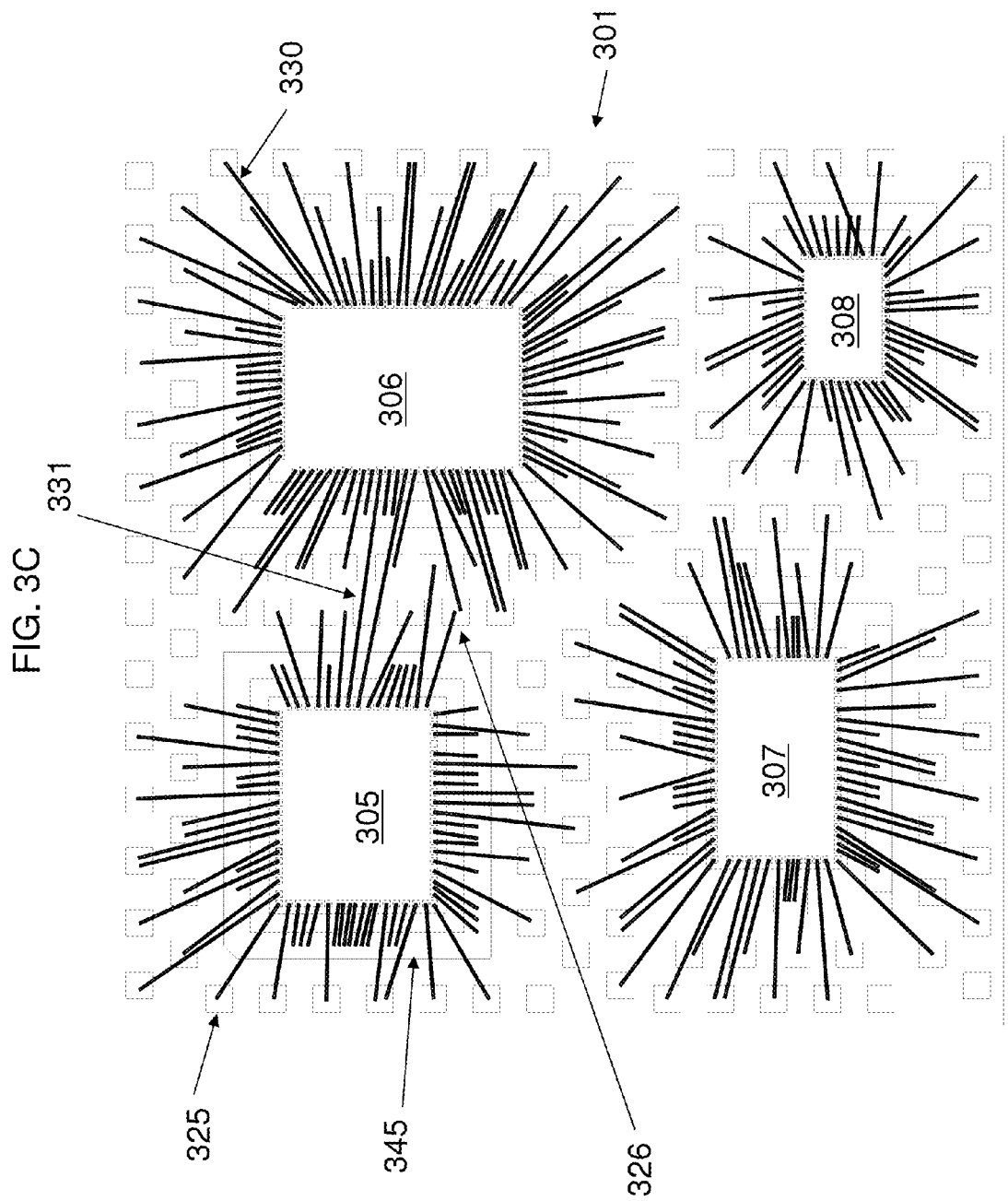
FIG. 3C is a top view of an embodiment of a leadless IC package in a multi-chip module arrangement having four die attach pads each having an IC chip mounted thereon.

Referring now to FIG. 3C, a top view is shown of an embodiment of a leadless IC package 301 in a multi-chip module arrangement having four IC chips 305-308 mounted in a generally side-by-side arrangement. For descriptive purposes, the top view of IC package 301 is shown before a molding layer has been applied. In the embodiment shown, wirebonds 330 can be seen electrically coupling IC chips 305-308 to electrical contacts 325. In the embodiment shown, IC chips 305-308 may be directly coupled to each other via wirebonds 330, as shown by IC chip 305 being coupled to IC chip 306 via wirebond 331. In various embodiments, wirebonds 330 may indirectly couple IC chips 305-308 via one or more electrical contacts 325, as shown by common electrical contact 326 providing an indirect coupling of IC chip 305 and IC chip 306.

Referring now to FIGS. 4A-4B collectively, side and top views are shown of an embodiment of a leadless IC package 400 having a system-in-package configuration. For descriptive purposes, the top view of IC package 400 in FIG. 4B is shown before a molding layer has been applied. In the embodiment shown, IC package 400 contains an IC chip 405 mounted therein and one or more passive components 450, such as, for example, chip resistor and/or chip capacitors, also mounted therein. Passive components 450 may be attached to one or more electrical contacts 425 using any electrically-conductive attachment media, such as, for example, silver-filled epoxy or solder paste.

Figure 4C:
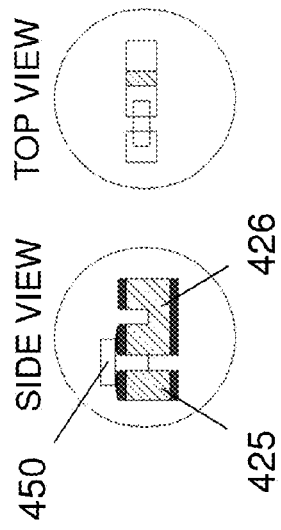
FIGS. 4C-4E are side and top views of Detail A of FIG. 4A showing various embodiments of an aspect of a leadless IC package.
Figure 4E:
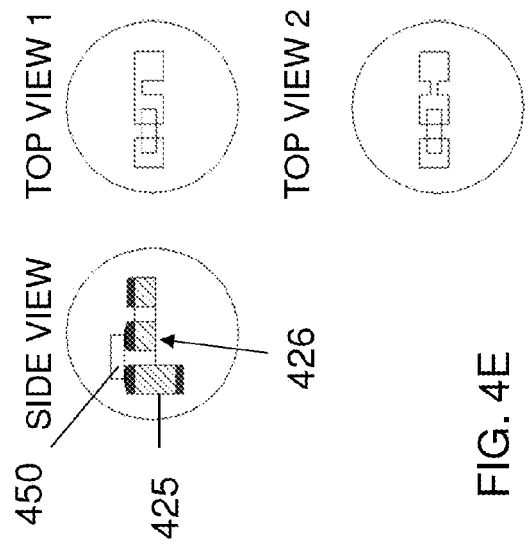
Figure 4D:
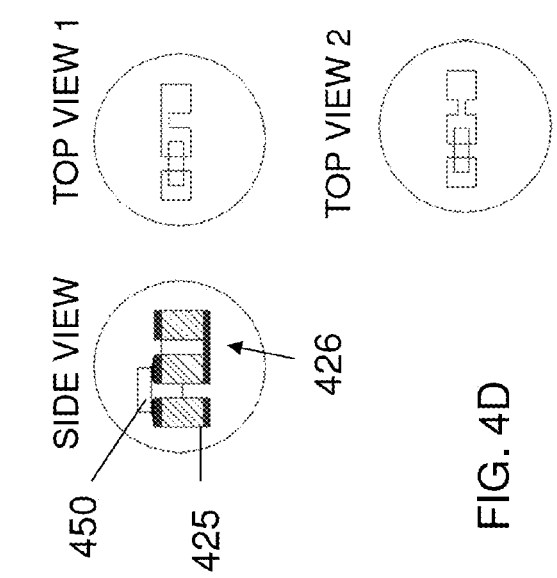

Referring now to FIGS. 4C-4E, side and top views of Detail A of FIG. 4A are shown for various embodiments of IC package 400. Referring now to FIG. 4C, passive component 450 is shown mounted between electrical contacts 425 and 426. When IC package 400 is mounted to a PCB, electrical contacts 425 and 426 may provide electrical connectivity between passive component 450 and the PCB. In the embodiment shown, electrical contact 426 is generally U-shaped such that passive component 450 may be coupled to a first portion of electrical contact 426 and a wirebond (not shown) may be coupled to a second portion thereof. The "moat" in a central portion of electrical contact 426 may help prevent solder paste from creeping from a first portion to a second portion thereof. Similar to FIG. 4C, in the embodiments shown in FIGS. 4D-4E, passive component 450 has been mounted between electrical contacts 425 and 426. However, electrical contact 426 in the various embodiments shown in FIGS. 4D-4E has been configured differently in accordance with various design criteria. For example, the partial etch along the length of electrical contact 426 may provide a larger lateral surface area for adhesion to a molding compound.

Figure 5:
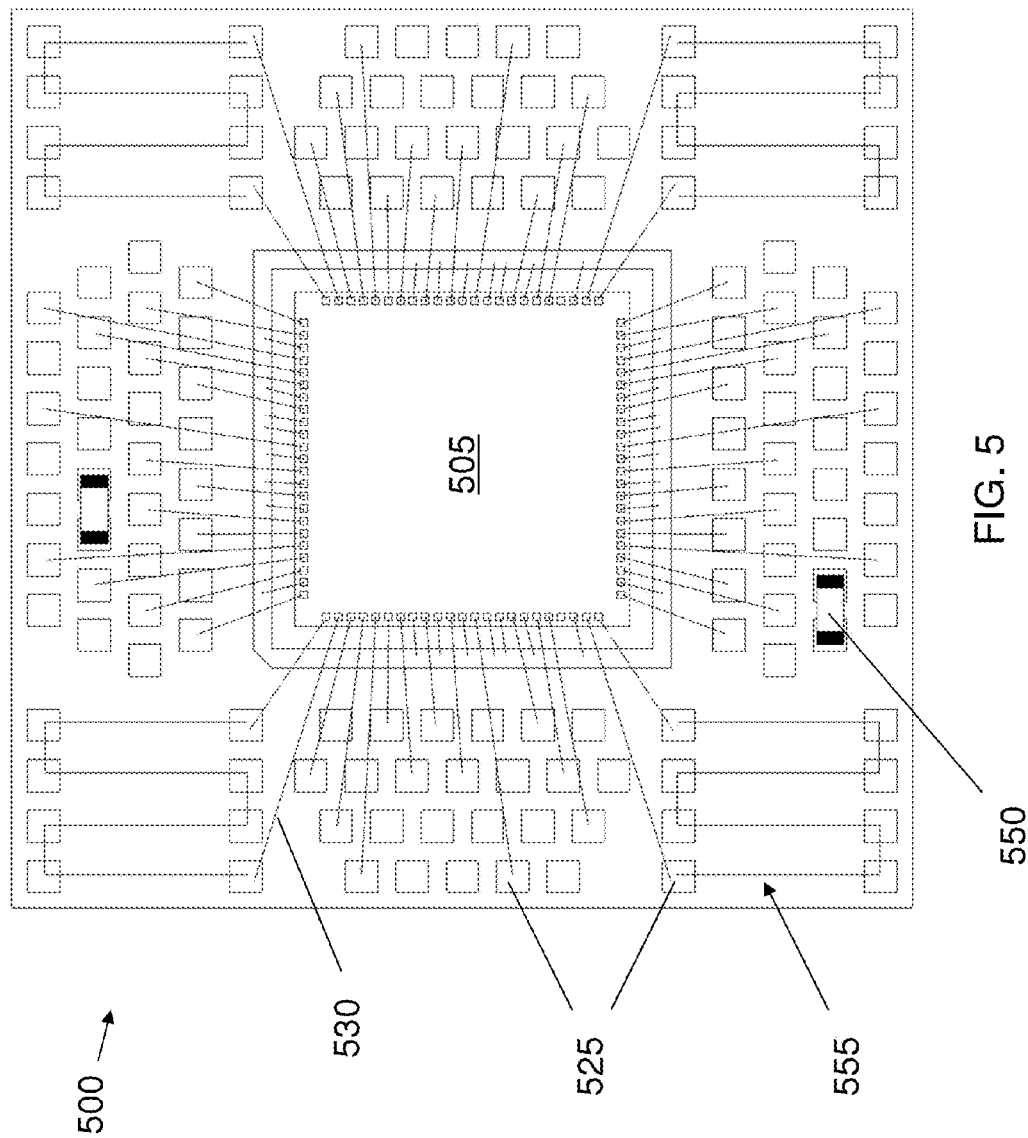
FIG. 5 is a top view of an embodiment of a leadless IC package having a system-in-package configuration.

Referring now to FIG. 5, a top view of an embodiment of a leadless IC package 500 having a system-in-package configuration is shown before an encapsulation layer has been added. Similar to the embodiment shown in FIG. 4B, IC package 500 has an IC chip 505 and one or more passive components 550 mounted therein, and a plurality of wirebonds 530 coupling IC chip 505 with one or more electrical contacts 525. However, in the embodiment shown, IC package 500 also contains an inductor 555 formed from a plurality of wirebonds 530 coupling a plurality of electrical contacts 525 to form a "daisy-chain" structure configured to provide inductance to IC chip 505, which is wirebonded to a first and last electrical contact 325 of the daisy-chain structure of inductor 555.

Referring now to FIGS. 6A-6B, side and bottom views of an embodiment of a leadless IC package 600 having a flip-chip configuration are shown. During manufacture, a partial etching of a leadframe strip is performed to define upper portions of electrical contacts 625. The upper portions of electrical contacts 625 form a die-attach area for supporting an IC chip 605 mounted thereon and coupled thereto via a plurality of flip-chip connections 660. Electrical contacts 625 for supporting IC chip 605 in a flip-chip configuration will be referred to interchangeably as electrical contacts or flip-chip terminals. Flip-chip connections 660 may be, for example, solder bumps, such as eutectic, Pb-free, and/or high-Pb, or may be copper pillars capped with, for example, tin or solder at a tip thereof. After mounting IC chip 605 to electrical contacts 625 using, for example, various reflow techniques, IC chip 605 may then be encapsulated with a molding compound 620 using a mold-underfill technique, where molding compound 620 surrounds IC chip 605 to provide increased mechanical protection from an external environment and improve the mechanical integrity of flip-chip connections 660 between IC package 605 and electrical contacts 625. In various embodiments, the mold-underfill process may be vacuum-assisted, depending on various design criteria, such as, for example, the density of flip-chip interconnections 660. Following the mold-underfill process, a bottom surface of the leadframe strip may be patterned to define lower portions of the electrical contacts 625, thereby separating them one-from-another. In various embodiments, two or more IC chips may be mounted within IC package 600 in a flip-chip configuration.

Referring now to FIGS. 7A-7B, side and bottom views are shown of an embodiment of a leadless IC package 700 having first and second IC chips 705 and 706 mounted therein. In the embodiment shown, IC package 700 includes first IC chip 705 mounted to DAP 710 and wirebonded to electrical contacts 725. IC package 700 also includes second IC chip 706 mounted to electrical contacts (also referred to as flip-chip terminals) 725 therein in a flip-chip configuration. In FIG. 7B, the areas where IC chips 705 and 706 are mounted within IC package 700, referred to as die-attach areas, are shown as dashed lines. As can be seen, DAP 710 encompasses die-attach area 712 of IC chip 705, whereas die-attach area 711 encompasses a plurality of flip-chip terminals 725.

Referring now to FIGS. 8A-8B, side and top views are shown of an embodiment of a leadless IC package 800 having an IC chip assembly mounted therein comprising a second IC chip 806 mounted to a first IC chip 805. For descriptive purposes, the top view of IC package 800 in FIG. 8B is shown before a molding layer has been applied. In the embodiment shown, first IC chip 805 is mounted to centrally disposed electrical contacts, or flip-chip terminals, 825 in a flip-chip configuration and second IC chip 806 is mounted to first IC chip 806 and wirebonded to peripherally disposed electrical contacts 825. In some embodiments, first IC chip 805 may be electrically coupled to second IC chip 806 via a common terminal 826, wherein first IC chip 805 is coupled to common terminal 826 via flip-chip connection 860 and second IC chip 806 is coupled to common terminal 826 via wirebond 830.

Figure 9:
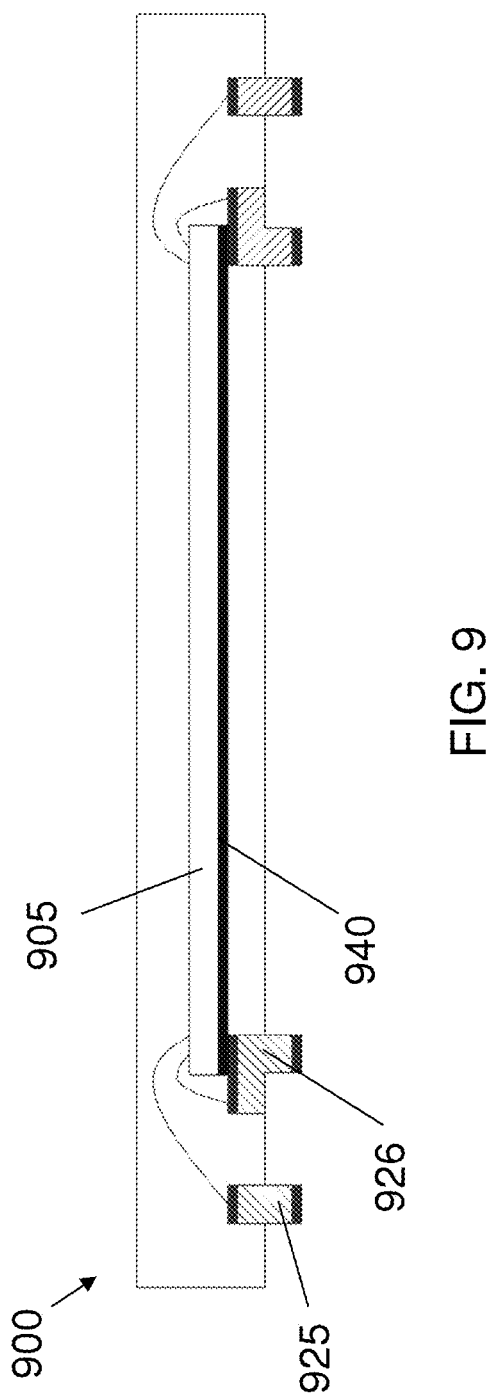
FIG. 9 is a side view of an embodiment of a leadless IC package in which a portion of the die attach pad has been etched away.

Referring now to FIG. 9, a side view of a "chip-on-pillar" or "chip-on-lead" embodiment of a leadless IC package 900 is shown in which a portion of a DAP has been etched away. In the embodiment shown, IC package 900 includes an IC chip 905 mounted therein having a non-electrically conductive adhesive layer 940 disposed on a bottom surface thereof, such as, for example, a low-bleed B-staged adhesive, a die-attach film (DAF), or a wafer backside coating (WBC), which may be applied utilizing screen printing, stencil printing, spin coating, or similar methods. After IC chip 905 has been mounted to a DAP, a central portion of the DAP may be etched away, such that only a peripheral portion of the DAP remains. The peripheral portions of the DAP 926 provide support for IC chip 905 and may provide a ground bond therefore. IC package 900 not having a DAP underneath IC chip 905 may be desirable for applications where routing on a PCB is required under IC chip 905.

Referring now to FIGS. 10A-10G collectively, side views of an embodiment of a leadless IC package 1000 (shown in FIG. 10G) having an air cavity formed therein are shown at various stages of an IC package manufacturing process. For simplicity, the IC manufacturing process will be described with respect to a single IC package. However, the process may be used to simultaneously manufacture several leadless IC packages with a single leadframe strip. While the IC package manufacturing process of FIGS. 10A-10G is described with respect to an IC package having an air cavity, many of the principles described below, in general, may be applied to the various other IC package embodiments described herein. Referring now to FIG. 10A, the IC package manufacturing process begins with an unetched leadframe 1001 formed of copper or another conductive material such as one of various metals or metal alloys.

Referring now to FIG. 10B, leadframe 1001 is partially etched on a top surface thereof to form recesses or patterns therein partially defining DAP 1010 and electrical contacts 1025. The patterns can be formed using any of several conventional etching techniques such as various forms of chemical or mechanical etching. Although not shown, the patterns can be defined initially by forming an etch mask over the leadframe 1001 and performing the etching based on the etch mask. Referring now to FIG. 10C, once the areas of DAP 1010 and electrical contacts 1025 are formed, top and/or bottom surfaces of those areas may be plated with plating layer 1035 using a double-sided selective plating process. Portions of plating layer 1035 disposed near a periphery of an upper surface of DAP 1010 may also form a ground ring 1045 thereon. Plating layers 1035 and 1045 may comprise a metal such as a stack-up of nickel (Ni), palladium (Pd) and gold (Au), a stack-up of nickel (Ni) and gold (Au) or silver (Ag). Plating layer 1035 on the bottom surface may be plated with the same material as the top surface, or with other metal finish such as silver (Ag), gold (Au), nickel (Ni) and gold (Au), or tin/lead (Sn/Pb) solder plating.

Referring now to FIG. 10D, sidewalls 1065 of IC package 1000 can be seen extending upwardly from outer edges of leadframe 1001. In various embodiments, sidewalls 1065 may be formed by filling a pre-formed mold with an encapsulant material 1020. Encapsulant material 1020 may also fill spaces between electrical contacts 1025 to form an encapsulant bottom surface 1070. Encapsulant material 1020 may be a polymer material, such as, for example, epoxy, silicone, thermoplastic, and/or liquid crystal polymer (LCP). Referring now to FIG. 10E, IC chip 1005 has been attached to an upper surface of the partially defined DAP 1010. Thereafter, wirebonds 1030 are formed to electrically couple IC chip 1005 to electrical contacts 1025 and/or ground ring 1045. Wire bonds 1030 may be formed using a conventional wire bonding technology, such as, e.g., gold, copper or aluminum wire bonding.

Referring now to FIG. 10F, a lid 1075 has been attached across the top of sidewalls 1065 to encapsulate the inside of IC package 1000. Lid 1075 may be attached using an adhesive, ultrasonic sealing, or other securing method. Lid 1075 may be opaque or, in some embodiments, may include a glass window for optical applications. In various embodiments, lid 1075, sidewalls 1065, and bottom encapsulant surface 1070 may be made of epoxy, silicone, thermoplastic (such as liquid crystal polymer) and/or other suitable polymeric materials.

Referring now to FIG. 10G, a bottom surface of leadframe strip 1001 is then back-etched to remove metal portions 1001' therefrom to define lower portions of electrical contacts 1025 and DAP 1010. In the resulting structure, a bottom surface of molding layer 1020 is exposed through the removed portions 1001' of leadframe 1001. In various embodiments, having an air-cavity disposed within IC package 1000 may be desirable, in applications, such as, for example, for high-speed/high-frequency applications, packages having a GaAs chip with unpassivated air bridges, MEMS, electro-optical applications such as biometrics, and/or complicated stacked dies where wire sweep from conventional molding is unacceptable.

Referring now to FIGS. 11A-11B, an embodiment of a leadless IC package 1100 having an air cavity therein and a lid 1175 for use therewith is shown. Similar to IC package 1000 of FIG. 10G, IC package 1100 has a lid 1175 configured to seal an air cavity therein. However, in the embodiment shown, lid 1175 has a translucent portion 1180 for allowing light to pass therethrough. For example, in some embodiments, translucent portion 1180 may be a optical lens or other translucent glass.

In view of the foregoing, it should be appreciated that leadless IC packages can be formed with electrical contacts and die attach pads having any of several different configurations to achieve a variety of different results. The different configurations can be achieved using manufacturing techniques such as those discussed above or any of several variations and/or substitutes available to those skilled in the art.

What is claimed:

1. A method of manufacturing a semiconductor package comprising:
   providing a leadframe strip having top and bottom surfaces and having recesses on the top surface partially defining upper portions of a plurality of electrical contacts;
   mounting a first IC chip to the leadframe strip;
   forming electrical connections between the plurality of partially defined electrical contacts and the first IC chip;
   forming a molding layer on the top surface of the leadframe strip, the molding layer filling the recesses; and
   removing a portion of the leadframe strip from the bottom surface to define lower portions of the plurality of electrical contacts.

2. The method of claim 1, wherein at least one of the electrical contacts protrudes from the molding layer.

3. The method of claim 1, wherein the first IC chip is mounted to the leadframe strip at least partially over the upper portions of one or more of the plurality of electrical contacts.

4. The method of claim 3, wherein the lower portion of at least one of the electrical contacts is beneath the first IC chip.

5. The method of claim 1, further comprising forming sidewalls on the top surface of the leadframe strip.

6. The method of claim 5, further comprising attaching a lid to the sidewalls.

7. The method of claim 1, further comprising mounting a second IC chip to the first IC chip in a stacked configuration.

8. The method of claim 1, further comprising mounting a second IC chip to the leadframe strip in a generally side-by-side configuration relative to the first IC chip.

9. The method of claim 1, further comprising mounting an electronic component to the leadframe strip.

10. The method of claim 1, further comprising:
    wherein the forming electrical connections includes wirebonding the first IC chip to first and second electrical contacts of the plurality of electrical contacts; and
    electrically coupling the first electrical contact to the second electrical contact by wirebonding the first electrical contact, the second electrical contact, and one or more electrical contacts of the plurality of electrical contacts in a daisy-chain configuration to provide inductance to the first IC chip.

11. A method of manufacturing a leadless integrated circuit (IC) package comprising:
    providing a leadframe strip having top and bottom surfaces and having recesses on the top surface partially defining upper portions of a plurality of electrical contacts;
    mounting a first IC chip to the leadframe strip;

forming electrical connections between the plurality of partially defined electrical contacts and the first IC chip;

forming a molding layer on the top surface of the leadframe strip, the molding layer filling the recesses; and selectively etching the bottom surface of the leadframe strip, thereby etching through portions of the leadframe strip to define lower portions of the plurality of electrical contacts.

12. The method of claim 11, wherein a groove is formed on a top surface of at least one of the electrical contacts.

13. The method of claim 11, wherein the first IC chip is mounted to the leadframe strip at least partially over the upper portions of one or more of the plurality of electrical contacts.

14. The method of claim 13, wherein the lower portion of at least one of the electrical contacts is beneath the first IC chip.

15. The method of claim 11, further comprising forming sidewalls on the top surface of the leadframe strip.

16. The method of claim 15, further comprising attaching a lid to the sidewalls.

17. The method of claim 11, further comprising mounting a second IC chip to the first IC chip in a stacked configuration.

18. The method of claim 11, further comprising mounting a second IC chip to the leadframe strip in a generally side-by-side configuration relative to the first IC chip.

19. The method of claim 11, further comprising mounting an electronic component to the leadframe strip.

20. The method of claim 11 and further comprising:

wherein the forming electrical connections includes wirebonding the first IC chip to first and second electrical contacts of the plurality of electrical contacts; and electrically coupling the first electrical contact to the second electrical contact by wirebonding the first electrical contact, the second electrical contact, and one or more electrical contacts of the plurality of electrical contacts in a daisy-chain configuration to provide inductance to the first IC chip.

* * * * *